(12) United States Patent
Kim

(10) Patent No.: US 11,568,947 B2
(45) Date of Patent: Jan. 31, 2023

(54) MEMORY DEVICE AND METHOD OF OPERATING THE SAME

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/363,735

(22) Filed: Jun. 30, 2021

(65) Prior Publication Data
US 2022/0208289 A1 Jun. 30, 2022

(30) Foreign Application Priority Data
Dec. 28, 2020 (KR) .......................... 10-2020-0185061

(51) Int. Cl.
| | | |
|---|---|---|
| *G11C 16/26* | (2006.01) | |
| *G11C 16/34* | (2006.01) | |
| *G11C 16/04* | (2006.01) | |
| *G11C 16/08* | (2006.01) | |
| *G11C 16/14* | (2006.01) | |
| *G11C 11/56* | (2006.01) | |

(52) U.S. Cl.
CPC ...... *G11C 16/3459* (2013.01); *G11C 16/0483* (2013.01); *G11C 16/08* (2013.01); *G11C 16/14* (2013.01); *G11C 11/5621* (2013.01); *G11C 11/5671* (2013.01)

(58) Field of Classification Search
CPC . G11C 16/3459; G11C 16/0483; G11C 16/08; G11C 16/14; G11C 11/5621; G11C 11/5671; G11C 11/5628; G11C 16/10; G11C 16/30
See application file for complete search history.

(56) References Cited

U.S. PATENT DOCUMENTS

| | | | | |
|---|---|---|---|---|
| 2011/0161571 A1* | 6/2011 | Kim | ................... | G11C 11/5628 |
| | | | | 711/E12.001 |
| 2012/0127791 A1* | 5/2012 | Lee | ................... | G11C 16/0483 |
| | | | | 365/185.03 |
| 2018/0068739 A1* | 3/2018 | Shiino | ................... | G11C 16/10 |
| 2020/0211663 A1* | 7/2020 | Baraskar | ............ | G11C 16/3459 |

FOREIGN PATENT DOCUMENTS

| | | |
|---|---|---|
| KR | 1020170011324 A | 2/2017 |
| KR | 1020170011644 A | 2/2017 |

* cited by examiner

*Primary Examiner* — Hien N Nguyen
(74) *Attorney, Agent, or Firm* — William Park & Associates Ltd.

(57) ABSTRACT

A memory device includes a memory cell array including a plurality of memory cells connected to a plurality of word lines. The memory device also includes a peripheral circuit configured to perform a plurality of program loops to program memory cells, among the plurality of memory cells, connected to a selected word line among the plurality of word lines. The memory device further includes control logic configured to control the peripheral circuit to set a step voltage based on the number of turned off memory cells among the selected memory cells and then apply a program voltage, to which the step voltage is added, to the selected word line in a next program loop, during a verify operation of a program operation and the verify operation included in each of the plurality of program loops.

21 Claims, 14 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0185061 filed on Dec. 28, 2020, in the Korean Intellectual Property Office, the entire disclosure of which is incorporated by reference herein.

BACKGROUND

1. Technical Field

The present disclosure relates to an electronic device, and more particularly, to a memory device and a method of operating the memory device.

2. Related Art

A storage device is a device that stores data under the control of a host device such as a computer, a smart phone, or a smart pad. The storage device may include a device that stores data on a magnetic disk such as a hard disk drive (HDD), a device that stores data in semiconductor memory such as a solid state drive (SSD), or a memory card, in particular, nonvolatile memory.

The storage device may include a memory device in which data is stored and a memory controller that stores data in the memory device. The memory device may be classified as a volatile memory or a nonvolatile memory. Here, nonvolatile memory includes read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

SUMMARY

An embodiment of the present disclosure is directed to a memory device that controls a step voltage based on the number of memory cells turned off during a pre-verify operation or a main verify operation, and a method of operating the same.

According to an embodiment of the present disclosure, a memory device may include a memory cell array including a plurality of memory cells connected to a plurality of word lines. The memory device may also include a peripheral circuit configured to perform a plurality of program loops to program memory cells, among the plurality of memory cells, connected to a selected word line among the plurality of word lines. The memory device may further include control logic configured to control the peripheral circuit to set a step voltage based on the number of turned off memory cells among the selected memory cells and then apply a program voltage, to which the step voltage is added, to the selected word line in a next program loop, during a verify operation of a program operation and the verify operation included in each of the plurality of program loops.

According to an embodiment of the present disclosure, a memory device may include a memory cell array including a plurality of memory cells connected to a plurality of word lines. The memory device may also include a peripheral circuit configured to perform a plurality of program loops to program memory cells, among the plurality of memory cells, connected to a selected word line among the plurality of word lines. The memory device may further include control logic including a memory cell counter to count the number of turned off memory cells among the selected memory cells, and a step voltage controller to control the peripheral circuit to set a step voltage based on the number of the turned off memory cells and then to apply a program voltage, to which the step voltage is added, to the selected word line in a next program loop, during a verify operation of a program operation and the verify operation included in each of the plurality of program loops.

According to an embodiment of the present disclosure, a method of operating a memory device including a plurality of memory cells connected to each of a plurality of word lines may include performing a program operation by applying a program voltage to a selected word line among the plurality of word lines and performing a verify operation by applying a verify voltage to the selected word line. The method may also include counting turned off memory cells among selected memory cells connected to the selected word line during the verify operation and setting a step voltage based on the counted number of turned off memory cells. The method may further include applying a program voltage, to which the step voltage is added, to the selected word line.

According to an embodiment of the present disclosure, a program operation speed may be improved by setting a step voltage differently based on the number of memory cells turned off during a pre-verify operation or a main verify operation included in a program loop.

DETAILED DESCRIPTION

Specific structural or functional descriptions of embodiments according to a concept which is disclosed in the present specification or application are illustrated only to describe the embodiments according to the concept of the present disclosure. The embodiments according to the concept of the present disclosure may be carried out in various forms and are not limited to the embodiments described in the present specification or application.

Hereinafter, embodiments of the present disclosure are described in detail with reference to the accompanying drawings, so that those skilled in the art to which the present disclosure pertains may carry out the technical spirit of the present disclosure.

Figure 1:
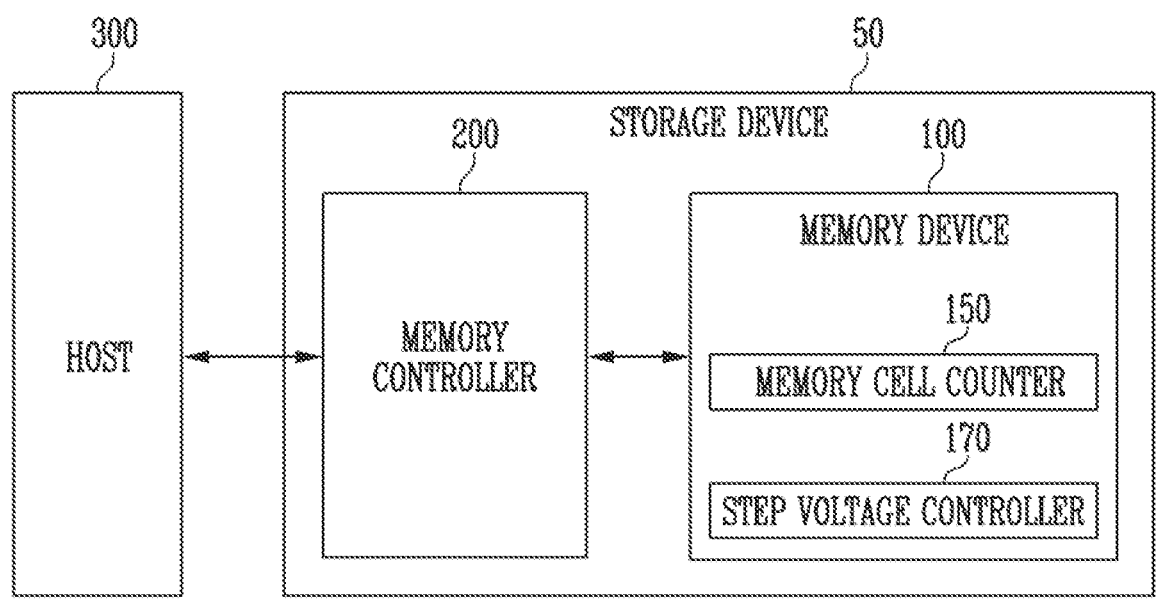
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device that stores data under the control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD; a multimedia card in a form of an MMC, an eMMC, an RS-MMC and a micro-MMC; a secure digital card in a form of an SD, a mini-SD and a micro-SD; a universal serial bus (USB) storage device; a universal flash storage (UFS) device; a personal computer memory card international association (PCMCIA) card type storage device; a peripheral component interconnection (PCI) card type storage device; a PCI express (PCI-E) card type storage device; a compact flash (CF) card; a smart media card; and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to the control of the memory controller 200. The memory device 100 may include a memory cell array including a plurality of memory cells storing data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. A memory block may be a unit for erasing data.

In an embodiment, the memory device 100 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 includes NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single-level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple-level cell (TLC) method of storing three data bits in one memory cell, or a quadruple-level cell (QLC) method of storing four data bits in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write operation (program operation), a read operation, or an erase operation according to the received command. For example, when a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a memory cell counter 150. The memory cell counter 150 may count the number of passed or failed memory cells during a verify operation among operations included in a program loop. Here, the program loop may be a loop performed when programming a selected memory cell connected to a selected word line, and may include a program operation in which a program pulse is applied to the selected word line and a verify operation in which a verify pulse is applied.

In an embodiment, a step voltage may be determined based on the number of passed or failed memory cells counted by the memory cell counter 150.

In an embodiment, the memory device 100 may include a step voltage controller 170. The step voltage controller 170 may determine the step voltage based on the number of passed memory cells or the number of failed memory cells counted by the memory cell counter 150.

Specifically, during the program operation on the selected memory cells of the memory device 100, when the number of passed memory cells counted by the memory cell counter 150 is greater than a preset reference value (or when the number of failed memory cells is less than the preset reference value), the step voltage controller 170 may generate a voltage signal so that a pulse higher than a previous program pulse by the step voltage is applied to the selected word line.

However, during the program operation on the selected memory cells of the memory device 100, when the number of passed memory cells counted by the memory cell counter 150 is less than or equal to the preset reference value (or when the number of failed memory cells is greater than or equal to the preset reference value), the step voltage controller 170 may generate a voltage signal so that a pulse additionally higher by an offset voltage than the pulse higher than the previous program pulse by the step voltage is applied to the selected word line.

At this time, the offset voltage may be set according to the number of times the program and erase operations on the selected memory cells are performed. For example, as the number of times the program and erase operations on the selected memory cells are performed increases, the offset voltage may be set to a smaller level, and as the number of times the program and erase operations on the selected memory cells are performed decreases, the offset voltage may be set to a higher level.

Because a size of the step voltage is set differently according to the number of passed memory cells or the number of failed memory cells counted by the memory cell counter 150, a program time may be shortened. That is, a time consumed for programming may be shortened by applying a program pulse of a higher level to memory cells having a low program speed.

The memory controller 200 may control the overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in buffer memory.

The memory controller 200 may control the memory device 100 to perform a program operation, a read operation, an erase operation, or the like according to a request from the host 300. For example, when a program request is received from the host 300, the memory controller 200 may convert the program request into a program command, and may provide the program command, a PBA, and data to the memory device 100. When a read request is received from the host 300 together with an LBA, the memory controller 200 may change the read request into a read command, select a PBA corresponding to the LBA, and then provide the read command and the PBA to the memory device 100. When an erase request is received from the host 300 together with an LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 so as to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as operation memory and cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as double data rate synchronous dynamic random access memory (DDR SDRAM), DDR4 SDRAM, low power double data rate4 (LPDDR4) SDRAM, graphics double data rate (GDDR) SDRAM, low power DDR (LPDDR), or Rambus dynamic random access memory (DRAM), or static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
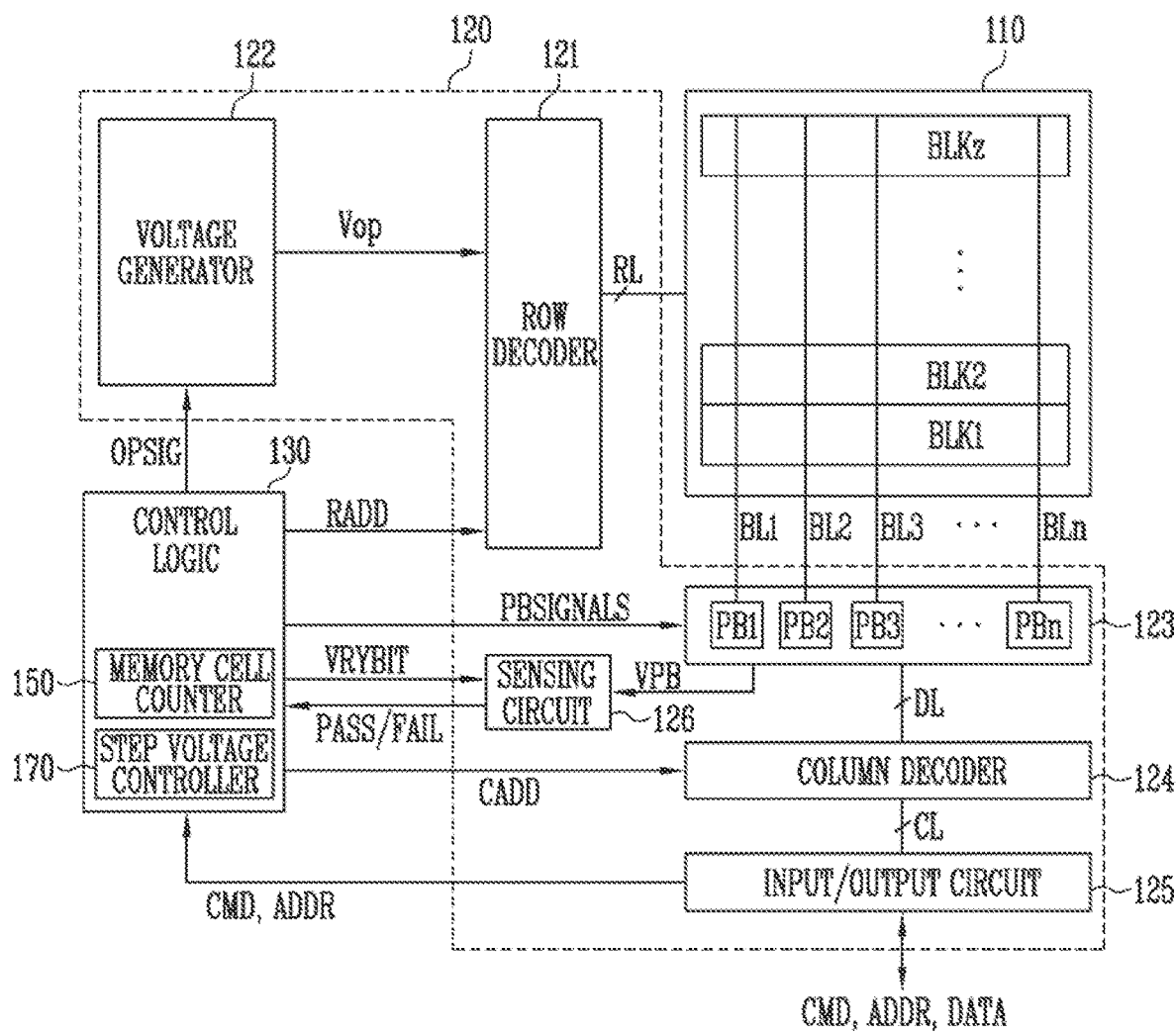
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on a selected area of the memory cell array 110 under the control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to an operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cells through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and output the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass signal PASS or the fail signal FAIL.

The control logic 130 may be implemented as hardware, software, or a combination of hardware and software. For example, the control logic 130 may be a control logic circuit operating in accordance with an algorithm and/or a processor executing control logic code. In an embodiment, the control logic 130 may include the memory cell counter 150 and the step voltage controller 170. In another embodiment, the memory cell counter 150 and the step voltage controller 170 may be included outside the control logic 130.

In an embodiment, the memory cell counter 150 may count the number of turned on or turned off memory cells based on the pass or fail signal PASS or FAIL received from the sensing circuit 126.

For example, when the memory device 100 performs a plurality of program loops, the selected memory cell may be turned off when a threshold voltage of the selected memory cell is greater than the verify voltage, and the selected memory cell may be turned on when the threshold voltage of the selected memory cell is less than the verify voltage. In an embodiment, the memory cell counter 150 may count the number of turned off memory cells or the number of turned on memory cells.

Here, when the memory device 100 programs the memory cells through a double verify program (DPGM), the verify voltage used for the verify operation may be a pre-verify voltage or a main verify voltage. The main verify voltage may be a verify voltage corresponding to a target program state, and the pre-verify voltage may have a level lower than that of the main verify voltage and may be a voltage for verifying a degree at which the program operation proceeds.

In an embodiment, the step voltage controller 170 may determine the step voltage based on the number of memory cells counted by the memory cell counter 150.

For example, when the number of turned off memory cells counted by the memory cell counter 150 is less than the preset reference value (or when the number of turned on memory cells counted by the memory cell counter 150 is greater than the preset reference value), the step voltage controller 170 may set a size of the program pulse to a size obtained by adding the offset voltage to the step voltage in the program loop performed after the verify operation. At this time, a size of the offset voltage may be determined by the number of times the program operation and the erase operation are performed on the selected memory cell. For example, as the number of times the program operation and the erase operation are performed increases, the offset voltage may be set to be smaller, and as the number of times the program operation and the erase operation are performed decreases, the offset voltage may be set to be larger.

However, when the number of turned off memory cells counted by the memory cell counter 150 is greater than or equal to the preset reference value (or when the number of turned on memory cells counted by the memory cell counter 150 is less than or equal to the preset reference value), the step voltage controller 170 may set the size of the program pulse largely by the step voltage in the program loop performed after the verify operation.

Thereafter, also in the program loop, the memory cell counter 150 may count the number of turned off memory cells or the number of turned on memory cells, and the step voltage controller 170 may determine the size of the step voltage based on the counted number of memory cells.

As a result, as the program loop proceeds, the step voltage controller 170 may set the step voltage size differently. Therefore, a time duration of the program performed on the selected memory cell may be shortened and program performance may be improved.

Figure 3:
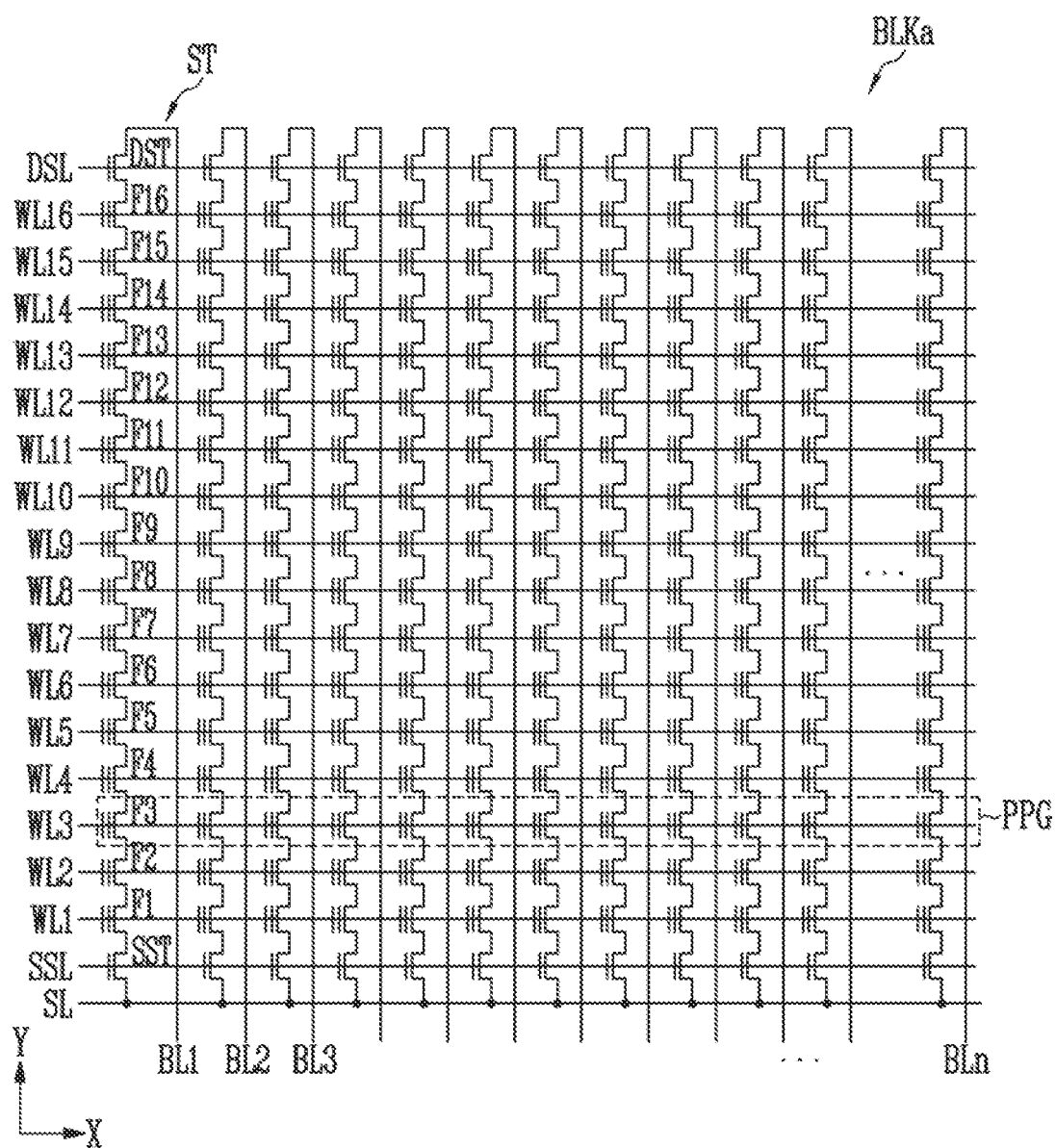
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Because the strings may be configured to be identical to each other, a string ST connected to the first bit line BL1 is specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as an SLC. In this case, one physical page PPG may store one logical page (LPG) data. One logical page (LPG) data may include data bits of the number of memory cells included in one physical page PPG. In addition, one memory cell may store two or more bits of data. This is commonly referred to as an MLC. In this case, one physical page PPG may store two or more logical page (LPG) data.

A memory cell in which two or more bits of data are stored in one memory cell is referred to as the MLC, but recently, as the number of bits of data stored in one memory cell increases, the MLC refers to a memory cell in which two bits of data is stored, a memory cell in which three or more bits of data are stored is referred to as a triple level cell (TLC), and a memory cell in which four or more bits of data are stored is referred to as a quadruple level cell (QLC). In addition, a memory cell method in which a plurality of bits of data are stored has been developed, and the present embodiment may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
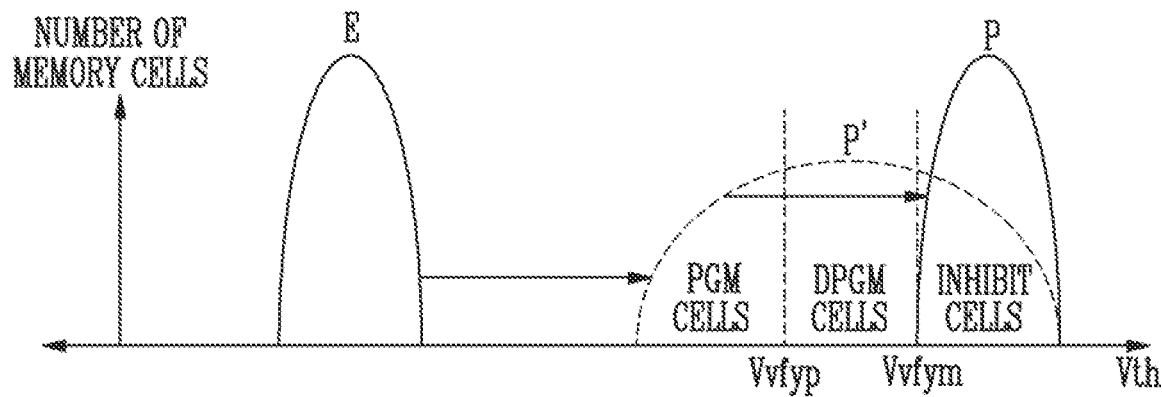
FIG. 4 is a diagram illustrating a double verify program.

FIG. 4 is a diagram illustrating a double verify program.

Referring to FIG. 4, FIG. 4 shows a process of programming memory cells from an erase state E to a program state P through a double verify program (DPGM). In FIG. 4, a horizontal axis represents a threshold voltage Vth of the memory cells, and a vertical axis represents the number of memory cells.

In FIG. 4, it is assumed that the memory device 100 of FIG. 1 performs the program operation by the SLC method. In another embodiment, FIG. 4 may be applied to a case where the memory device 100 of FIG. 1 performs the program operation by the MLC method, the TLC method, or the QLC method.

Referring to FIG. 4, the memory cells of the erase state E may be programmed to the program state P through the DPGM. At this time, the memory cells of the erase state E may be programmed to the program state P through a P' state.

In an embodiment, the DPGM may include a program pulse apply operation and a verify operation. Here, the verify operation may be performed with two verify voltage levels. At this time, the two verify voltages may be a pre-verify voltage Vvfyp and a main verify voltage Vvfym. The main verify voltage Vvfym may be a verify voltage corresponding to a target program state P, and the pre-verify voltage Vvfyp may be a level lower than that of the main verify voltage Vvfym and may be a voltage for verifying a degree at which the program operation proceeds.

Therefore, the verify operation may include a verify operation performed with the pre-verify voltage Vvfyp and a verify operation performed with the main verify voltage Vvfym.

In an embodiment, after the program pulse is applied to the memory cells of the erase state E, the verify operation may be performed with the pre-verify voltage Vvfyp and the main verify voltage Vvfym. As a result of the verify operation, the memory cells may be divided into first program permission memory cells PGM CELLS having a threshold voltage lower than the pre-verify voltage Vvfyp, second program permission memory cells DPGM CELLS having a threshold voltage higher than the pre-verify voltage Vvfyp and lower than the main verify voltage Vvfym, and a program inhibition memory cells INHIBIT CELLS having a threshold voltage higher than the main verify voltage Vvfym.

Because the program inhibition memory cells INHIBIT CELLS having the threshold voltage higher than the main verify voltage Vvfym are already in the target program state P, the program pulse might not applied to a gate of the program inhibition memory cells INHIBIT CELLS any more.

However, because the first program permission memory cells PGM CELLS and the second program permission memory cells DPGM CELLS do not reach the target program state P, the program pulse may be applied to the corresponding memory cells again.

At this time, a voltage level of a bit line connected to each of the first program permission memory cells PGM CELLS and a voltage level of a bit line connected to each of the second program permission memory cells DPGM CELLS may be set differently.

That is, the first program permission memory cells PGM CELLS having the threshold voltage lower than the pre-verify voltage Vvfyp are slow cells on which the program operation is performed at a relatively slow speed, and the second program permission memory cells DPGM CELLS having the threshold voltage higher than the pre-verify voltage Vvfyp and lower than the main verify voltage Vvfym are fast cells on which the operation is performed at a relatively fast speed, the program operation may be performed by setting different voltage levels of the bit lines respectively connected to the first program permission memory cells PGM CELLS and the second program permission memory cells DPGM CELLS.

For example, the voltage level of the bit line connected to each of the first program permission memory cells PGM CELLS may be set as a ground voltage GND, and the voltage level of the bit line connected to each of the second program permission memory cells DPGM CELLS may be set to a specific level other than the ground voltage GND. That is, because the second program permission memory cells DPGM CELLS have a relatively high program speed compared to the first program permission memory cells PGM CELLS, the voltage of the bit line may be set to the specific level other than the ground voltage GND in consideration of the program speed.

As a result, as the voltage level of the bit line connected to each of the first program permission memory cells PGM CELLS and the voltage of the bit line connected to each of the second program permission memory cells DPGM CELLS are set differently, a threshold voltage distribution of the memory cells may be formed narrow.

Figure 5:
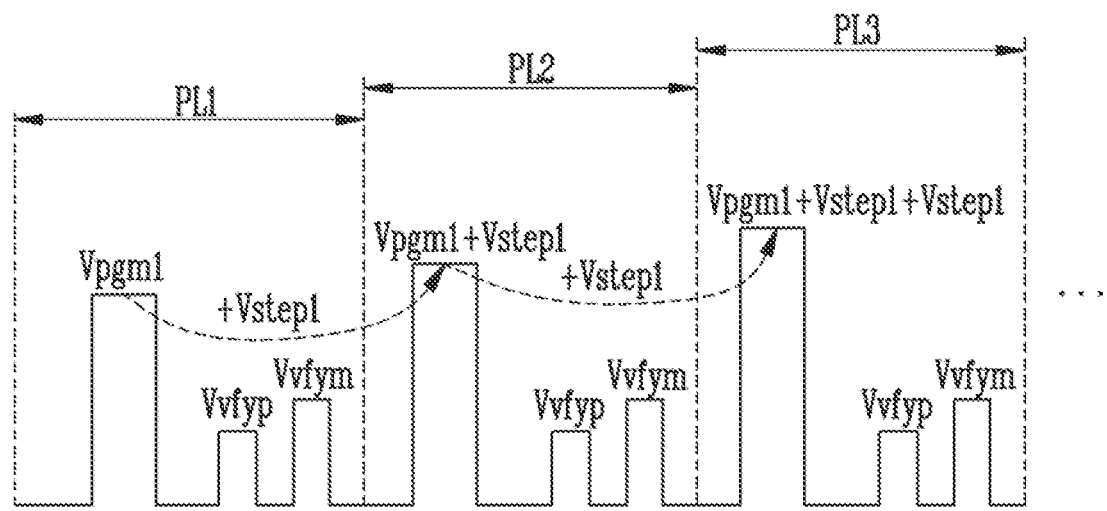
FIG. 5 illustrates program loops performed when programming a selected memory cell.

FIG. 5 illustrates program loops performed when programming a selected memory cell.

Referring to FIGS. 4 and 5, FIG. 5 is a diagram illustrating some of a plurality of program loops performed on the selected memory cells when memory cells are programmed through the DPGM of FIG. 4.

In FIG. 5, the DPGM is performed from a first program loop PL1, but in an embodiment, the DPGM may be started in a specific loop.

When it is assumed that the DPGM is performed from a third program loop PL3, first and second program loops PL1 and PL2 may be performed in a normal program method. That is, the first and second program loops PL1 and PL2 may include a program operation of applying one program pulse and a verify operation of applying one verify pulse.

In an embodiment, the selected memory cell among the plurality of memory cells included in the memory block may be programmed. In order to program the selected memory cell, at least one program loop may be performed on the selected memory cell. The program loop may include the program operation of applying the program voltage to the word line to which the selected memory cell is connected, and the verify operation of determining whether the program of the selected memory cell is completed.

In an embodiment, the first program loop PL1 may include a program operation of applying a first program voltage Vpgm1 to the word line and the verify operation of applying the pre-verify voltage Vvfyp and the main verify voltage Vvfym to the word line. Here, the main verify voltage Vvfym may be the verify voltage corresponding to the target program state, and the pre-verify voltage Vvfyp may be a level lower than that of the main verify voltage Vvfym and may be the voltage for verifying the degree at which the program operation proceeds.

Therefore, in order to program the selected memory cell, the first program voltage Vpgm1 may be applied to the word line to which the selected memory cell is connected. After the first program voltage Vpgm1 is applied to the word line to which the selected memory cell is connected, the pre-verify voltage Vvfyp and the main verify voltage Vvfym may be applied to the word line to check whether the selected memory cell is programmed.

In an embodiment, when the first program loop PL1 is performed, but the selected memory cell is not programmed, the second program loop PL2 may be performed on the selected memory cell. The second program loop PL2 may include a program operation of applying a voltage Vpgm1+Vstep1 higher than the first program voltage Vpgm1 by a first step voltage Vstep1 to the word line, and the verify operation of applying the pre-verify voltage Vvfyp and the main verify voltage Vvfym to the word line. The first step voltage Vstep1 may be a preset default step voltage when programming the select memory cells by an incremental step pulse programming (ISPP) method.

Thereafter, the plurality of program loops may be performed on the memory cell until the selected memory cell is programmed. In addition, as the program loop proceeds, the voltage applied to the word line to which the selected memory cell is connected may be sequentially increased by the step voltage.

That is, in the third program loop PL3 performed after the second program loop PL2, a voltage Vpgm1+Vstep1+Vstep1 that is larger by the first step voltage than the voltage applied in the second program loop PL2 may be applied to the word line to which the memory cell is connected.

However, as the program loop proceeds, because the program voltage increases by a step voltage of the same size, that is, the first step voltage Vstep1, time consumed for programming the selected memory cell may increase.

Therefore, in the present disclosure, a method of reducing the time consumed for programming the selected memory cell by setting the size of the step voltage as the program loop proceeds is provided.

Figure 6:
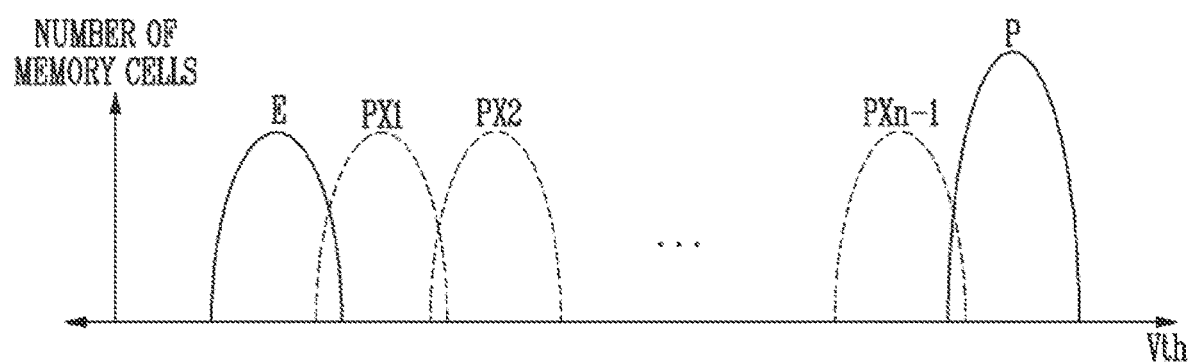
FIG. 6 illustrates a threshold voltage distribution moved whenever the program loops of FIG. 5 proceeds.

FIG. 6 illustrates a threshold voltage distribution moved whenever the program loops of FIG. 5 proceed.

Referring to FIGS. 5 and 6, FIG. 6 shows a threshold voltage distribution movement of the memory cells when the program loops are sequentially performed in FIG. 5. In FIG. 6, a horizontal axis represents the threshold voltage Vth of the memory cells and a vertical axis represents the number of memory cells. In FIG. 6, it is assumed that the memory device 100 of FIG. 1 performs the program operation in the SLC method.

In an embodiment, the plurality of program loops may be performed when the program operation on the selected memory cells of the erase state E is performed. At this time, the memory cells of the erase state E may be programmed to the target program state P through various states.

In an embodiment, when the first program loop PL1 is performed on the selected memory cells, the threshold voltage distribution of the memory cells of the erase state E may be programmed to a PX1 distribution.

However, because the program of the memory cells of the erase state is not completed by the first program loop PL1, the second program loop PL2 may be performed after the first program loop PL1. When the second program loop PL2 is performed on the selected memory cells, the threshold voltage distribution of the memory cells may be changed from the PX1 distribution to a PX2 distribution.

Thereafter, in an n-th program loop PLn, the threshold voltage distribution of the selected memory cells may be changed from a PXn−1 distribution to a P distribution. Therefore, the selected memory cells may be programmed through first to n-th program loops PL1 to PLn.

However, when the selected memory cells are programmed through the above process, a movement speed of the threshold voltage distribution of the selected memory cells may be low, and thus the time consumed for the program may increase. That is, as the program loop proceeds, because the program voltage is sequentially increased by the step voltage size, a width of the movement of the threshold voltage distribution of the selected memory cells may be relatively small, and thus the time consumed for the program may be relatively long.

Therefore, as the program loop proceeds, a method of increasing the program voltage becomes problem.

Figure 7:
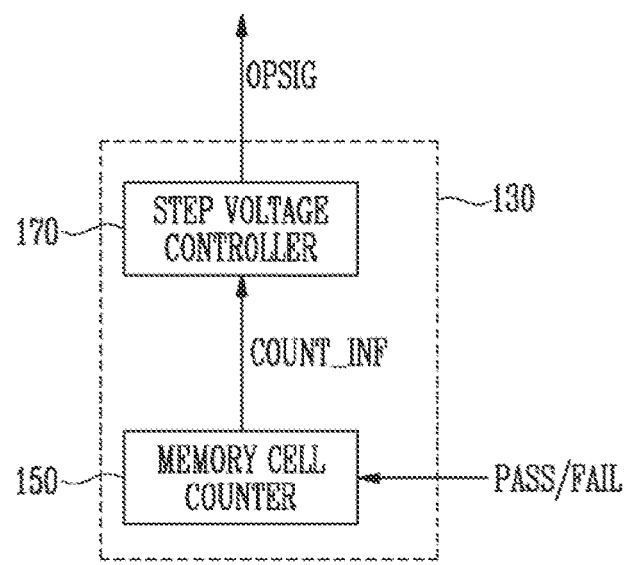
FIG. 7 illustrates a configuration of control logic for generating a program voltage, on which a step voltage set based on count information, is reflected.

FIG. 7 illustrates a configuration of control logic for generating a program voltage, on which a step voltage set based on count information, is reflected.

Referring to FIGS. 2 and 7, the control logic 130 of FIG. 2 may include the memory cell counter 150 and the step voltage controller 170.

In an embodiment, the memory cell counter 150 may count the number of turned on or turned off memory cells based on the pass or fail signal PASS or FAIL received from the sensing circuit 126 of FIG. 2.

Specifically, when the memory device 100 of FIG. 2 performs the plurality of program loops, the pass signal PASS may be output from the sensing circuit 126 of FIG. 2 when the threshold voltage of the selected memory cells is greater than the verify voltage, the fail signal FAIL may be output from the sensing circuit 126 of FIG. 2 when the threshold voltage of the selected memory cells is less than the verify voltage.

The memory cell counter 150 may count the pass signal PASS output from the sensing circuit 126 of FIG. 2 and output count information COUNT_INF. That is, the memory cell counter 150 may output the count information COUNT_INF including information on the number of turned off memory cells during the verify operation.

In another embodiment, the memory cell counter 150 may count the fail signal FAIL output from the sensing circuit 126 of FIG. 2 and output the count information COUNT_INF. That is, the memory cell counter 150 may output the count information COUNT_INF including information on the number of turned on memory cells during the verify operation.

In the present drawing, it is assumed that the memory cell counter 150 counts the number of turned off memory cells.

In an embodiment, the step voltage controller 170 may output the operation signal OPSIG based on the count information COUNT_INF received from the memory cell counter 150. At this time, the operation signal OPSIG may be a signal instructing generation of the program voltage applied to the selected word line to which the selected memory cells are connected.

Specifically, the step voltage controller 170 may determine the size of the step voltage applied to the selected word line in the next program loop based on the count information COUNT_INF, and output the operation signal OPSIG instructing the generation of the program voltage reflecting the determined size of the step voltage.

For example, when the number of turned off memory cells included in the count information COUNT_INF is less than the preset reference value, the step voltage controller 170 may determine a voltage greater than the existing step voltage by an offset voltage as the step voltage. That is, the step voltage controller 170 may additionally increase the program voltage applied to the selected word line in the next program loop.

Therefore, the step voltage controller 170 may output the operation signal OPSIG instructing to generate a program voltage of a size obtained by adding the step voltage and the offset voltage to the program voltage applied to the selected word line in the previous program loop.

However, when the number of turned off memory cells included in the count information COUNT_INF is greater than or equal to the preset reference value, the step voltage controller 170 may set the existing step voltage as the step voltage.

Therefore, the step voltage controller 170 may output the operation signal OPSIG instructing to generate a voltage of a size obtained by adding the step voltage to the program voltage applied to the selected word line in the previous program loop.

Figure 8:
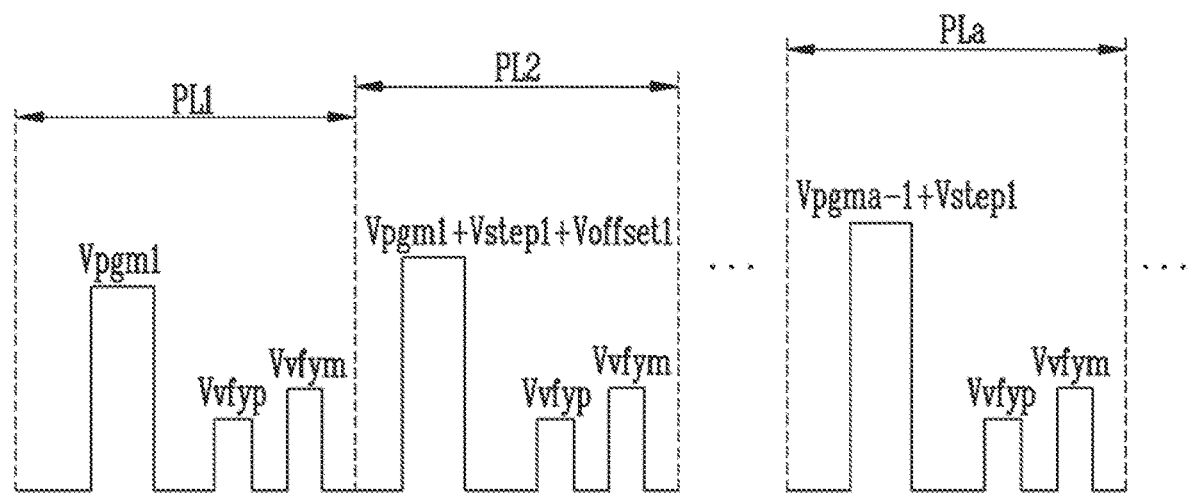
FIG. 8 illustrates a step voltage, determined when a reference value is one, and program loops.

FIG. 8 illustrates a step voltage determined when a reference value is one and program loops.

Referring to FIGS. 7 and 8, FIG. 8 shows a step voltage determined based on a result of comparing the number of turned off memory cells OFFCELL_NUM included in the count information COUNT_INF of FIG. 7 and a first reference value REF_VAL1, and the program loops performed with the determined step voltage. The first reference value REF_VAL1 may be set in advance.

In an embodiment, the memory device 100 of FIG. 2 may perform the plurality of program loops to program the selected memory cells.

In FIG. 8, the memory device 100 of FIG. 2 may program the selected memory cells through the normal program operation or the DPGM. The normal program operation may be an operation of performing the verify operation with one verify voltage during the verify operation, and the DPGM may be an operation of performing the pre-verify operation and the main verify operation, that is, the verify operation through two verify voltages. The DPGM may be performed from the first program loop PL1 or may be performed from a specific program loop.

Here, the pre-verify operation may be the verify operation performed by applying the pre-verify voltage Vvfyp to the selected word line, and the main verify operation may be the verify operation performed by applying the main verify voltage Vvfym to the selected word line. The main verify voltage Vvfym may be the verify voltage corresponding to the target program state, and the pre-verify voltage Vvfyp may be the level lower than that of the main verify voltage Vvfym and may be the voltage for verifying the degree at which the program operation proceeds.

First, the memory device 100 of FIG. 2 may perform the first program loop PL1. The first program loop PL1 may include the program operation and the verify operation. Therefore, the memory device 100 of FIG. 2 may perform the program operation by applying the first program voltage Vpgm1 to the selected word line, and then perform the verify operation by applying the pre-verify voltage Vvfyp and the main verify voltage Vvfym.

In FIG. 8, the verify operation included in the first program loop PL1 is performed with the pre-verify voltage Vvfyp and the main verify voltage Vvfym. However, when the selected memory cells are programmed through the normal program operation, the verify operation may also be performed with only the main verify voltage Vvfym.

In an embodiment, when the verify operation included in the first program loop PL1 includes the pre-verify operation and the main verify operation, the memory cell counter 150 of FIG. 7 may count the number of turned off memory cells based on the fail signal FAIL received from the sensing circuit 126 of FIG. 2 during the pre-verify operation or the fail signal FAIL received from the sensing circuit 126 of FIG. 2 during the main verify operation.

In an embodiment, when the number of turned off memory cells is less than the first reference value REF_VAL1, the size of the program voltage applied to the selected word line in the second program loop PL2 may be set to a size Vpgm1+Vstep1+Voffset1 obtained by adding a first step voltage Vstep1 and a first offset voltage Voffset1 to a first program voltage Vpgm1. Here, a size of the first offset voltage Voffset1 may decrease as the number of times of program operations and erase operations performed on the selected memory cells increases. The first step voltage Vstep1 may be a preset default step voltage when programming the selected memory cells in the ISPP method.

That is, the step voltage controller 170 of FIG. 7 may set the size of the step voltage to the size obtained by summing the first step voltage Vstep1 and the first offset voltage Voffset1 based on the count information COUNT_INF received from the memory cell counter 150 of FIG. 7.

However, when the number of turned off memory cells is greater than or equal to the first reference value REF_VAL1, the size of the program voltage applied to the selected word line in the second program loop PL2 may be set to a size Vpgm1+Vstep1 obtained by adding the first step voltage Vstep1 to the first program voltage Vpgm1. That is, the step voltage controller 170 of FIG. 7 may set the size of the step voltage as the first step voltage Vstep1 based on the count information COUNT_INF received from the memory cell counter 150 of FIG. 7.

In an embodiment, when the verify operation included in the first program loop PL1 includes only the main verify operation, the memory cell counter 150 of FIG. 7 may count the number of turned off memory cells based on the fail signal FAIL received from the sensing circuit 126 of FIG. 2 during the main verify operation. In addition, when the number of turned off memory cells is less than the first reference value REF_VAL1, the step voltage controller 170 of FIG. 7 may set the size of the step voltage to the size obtained by summing the first step voltage Vstep1 and the first offset voltage Voffset1, and when the number of turned off memory cells is greater than or equal to the first reference value REF_VAL1, the step voltage controller 170 of FIG. 7 may set the size of the step voltage as the first step voltage Vstep1.

In FIG. 8, when the memory device 100 of FIG. 2 performs the first program loop PL1, it is assumed that the number of turned off memory cells is less than the first reference value REF_VAL1. Therefore, when the memory device 100 of FIG. 2 performs the second program loop PL2, the size of the step voltage may be set to the size obtained by summing the first step voltage Vstep1 and the first offset voltage Voffset1, and the program voltage Vpgm1+Vstep1+Voffset1 of the size obtained by summing the first program voltage Vpgm1, the first step voltage Vstep1, and the first offset voltage Voffset1 may be applied to the selected word line.

Thereafter, in the program loops, when the number of turned off memory cells is less than the first reference value REF_VAL1, the size of the step voltage may be set to the size obtained by summing the first step voltage Vstep1 and the first offset voltage Voffset1. That is, as the program loop proceeds, the size of the program voltage may increase by the size obtained by summing the first step voltage Vstep1 and the first offset voltage Voffset1.

In an embodiment, in an (a−1)-th program loop PLa−1 performed before an a-th program loop PLa, the number of turned off memory cells may be greater than or equal to the first reference value REF_VAL1 during the pre-verify operation or the main verify operation. In this case, in the a-th program loop PLa, which is the next program loop, the size of the step voltage may be set as the first step voltage Vstep1. Therefore, a program voltage Vpgma−1+Vstep1 of a size obtained by summing the first step voltage Vstep1 and an (a−1)-th program voltage Vpgma−1, which is applied to the selected word line in the (a−1)-th program loop PLa−1, may be applied to the selected word line in the a-th program loop PLa.

Thereafter, in the program loops, when the number of turned off memory cells is greater than or equal to the first reference value REF_VAL1, the step voltage may be set as the first step voltage Vstep1. That is, as the program loop proceeds, the size of the program voltage may increase by the first step voltage Vstep1.

As a result, as the program loop proceeds, the size of the step voltage may be set differently based on the number of turned off memory cells, thereby improving the program speed.

Figure 9:
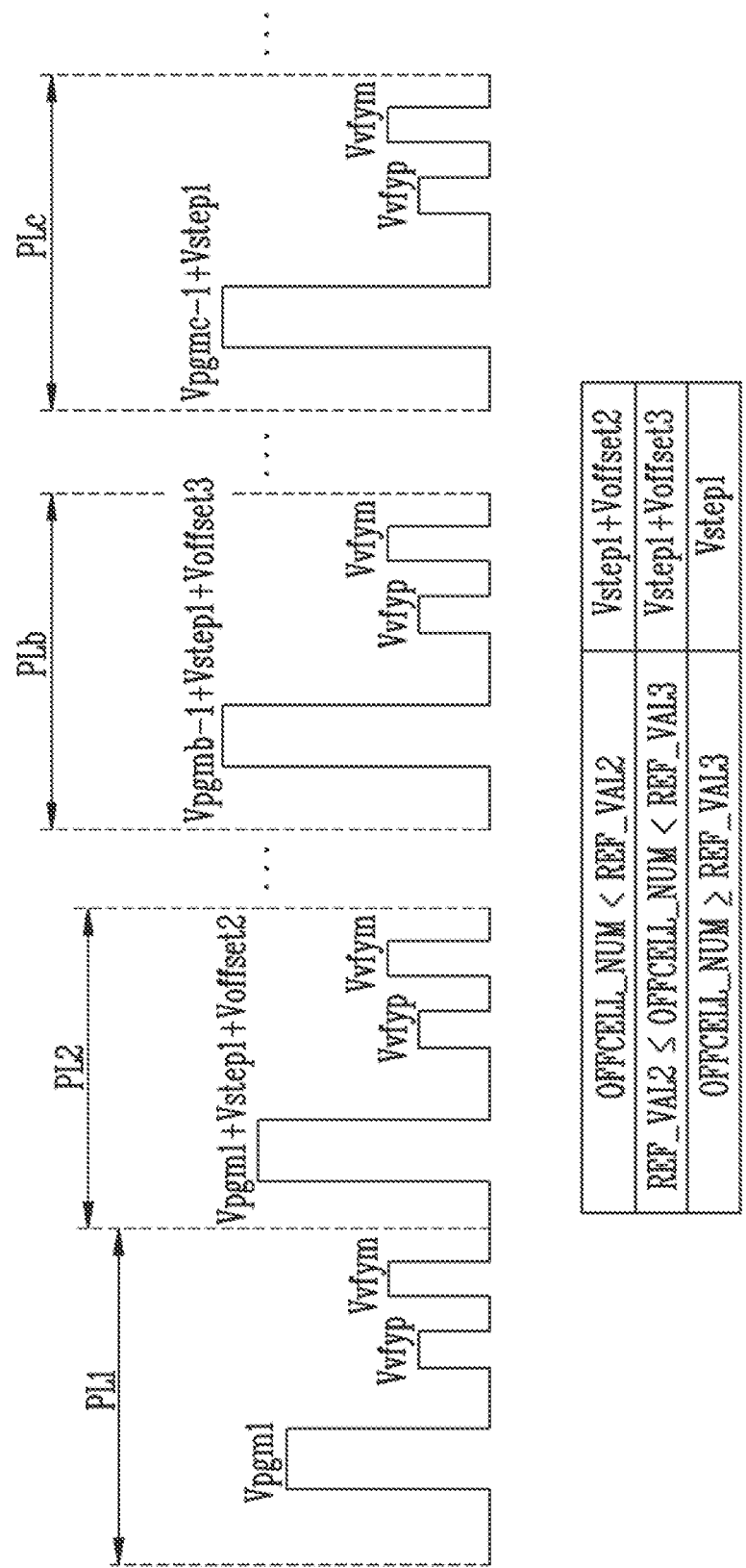
FIG. 9 illustrates an embodiment of a step voltage, determined when the number of reference values is plural, and program loops.

FIG. 9 illustrates an embodiment of a step voltage determined when the number of reference values is plural and program loops.

Referring to FIGS. 7 and 9, FIG. 9 shows a step voltage determined based on a result of comparing the number of turned off memory cells OFFCELL_NUM included in the count information COUNT_INF of FIG. 7 and second and third reference values REF_VAL2 and REF_VAL3, and the program loops performed with the determined step voltage. The second and third reference values REF_VAL2 and REF_VAL3 may be set in advance.

Referring to FIG. 9, differently from FIG. 8, FIG. 9 shows a method of setting the step voltage based on two reference values. That is, the step voltage may be set by subdividing the number of turned off memory cells.

Similarly to FIG. 8, in FIG. 9, the memory device 100 of FIG. 2 may program the selected memory cells through the normal program operation or the DPGM. In addition, the DPGM may be performed from the first program loop PL1 or may be performed from a specific program loop.

First, the memory device 100 of FIG. 2 may perform the first program loop PL1. The first program loop PL1 may include the program operation and the verify operation. Therefore, the memory device 100 of FIG. 2 may perform the program operation by applying the first program voltage Vpgm1 to the selected word line, and then perform the verify operation by applying the pre-verify voltage Vvfyp and the main verify voltage Vvfym.

Similarly to FIG. 8, in FIG. 9, the verify operation included in the first program loop PL1 is performed with the pre-verify voltage Vvfyp and the main verify voltage Vvfym. However, when the selected memory cells are programmed through the normal program operation, the verify operation may also be performed with only the main verify voltage Vvfym.

In an embodiment, during the pre-verify operation or the main verify operation, when the number of turned off memory cells is less than the second reference value REF_VAL2, the size of the program voltage applied to the selected word line in the second program loop PL2 may be set to a size Vpgm1+Vstep1+Voffset2 obtained by adding a first step voltage Vstep1 and a second offset voltage Voffset2 to a first program voltage Vpgm1. The first step voltage Vstep1 may be a preset default step voltage when programming the selected memory cells in the ISPP method. Here, a size of the second offset voltage Voffset2 may decrease as the number of times the program operations and the erase operations performed on the selected memory cells increases.

However, when the number of turned off memory cells is greater than or equal to the second reference value REF_VAL2 and less than the third reference value REF_VAL3, the size of the program voltage applied to the selected word line in the second program loop PL2 may be set to a size Vpgm1+Vstep1+Voffset3 obtained by adding the first step voltage Vstep1 and a third offset voltage Voffset3 to the first program voltage Vpgm1. At this time, a size of the third offset voltage Voffset3 may be less than the second offset voltage Voffset2. In addition, the size of the third offset voltage Voffset3 may decrease as the number of times the program operations and the erase operations performed on selected memory cells increases.

In addition, when the number of turned off memory cells is greater than or equal to the third reference value REF_VAL3, the size of the program voltage applied to the selected word line in the second program loop PL2 may be set to a size Vpgm1+Vstep1 obtained by adding the first step voltage Vstep1 to the first program voltage Vpgm1.

In FIG. 9, when the memory device 100 of FIG. 2 performs the first program loop PL1, it is assumed that the number of turned off memory cells is less than the second reference value REF_VAL2. Therefore, when the memory device 100 of FIG. 2 performs the second program loop PL2, the size of the step voltage may be set to the size obtained by summing the first step voltage Vstep1 and the second offset voltage Voffset2, and the program voltage Vpgm1+Vstep1+Voffset2 of the size obtained by summing the first program voltage Vpgm1, the first step voltage Vstep1, and the second offset voltage Voffset2 may be applied to the selected word line.

Thereafter, in the program loops, when the number of turned off memory cells is less than the second reference value REF_VAL2, the size of the step voltage may be set to the size obtained by summing the first step voltage Vstep1 and the second offset voltage Voffset2. That is, as the program loop proceeds, the size of the program voltage may increase by the size obtained by summing the first step voltage Vstep1 and the second offset voltage Voffset2.

In an embodiment, in a (b−1)-th program loop PLb−1 performed before a b-th program loop PLb, the number of turned off memory cells may be greater than or equal to the second reference value REF_VAL2 and less than the third reference value REF_VAL3 during the pre-verify operation or the main verify operation. In this case, in the b-th program loop PLb, which is the next program loop, the size of the step voltage may be set to the size obtained by summing the first step voltage Vstep1 and the third offset voltage Voffset3. Therefore, a program voltage Vpgmb−1+Vstep1+Voffset3 of a size obtained by summing the first step voltage Vstep1, the third offset voltage Voffset3, and a (b−1)-th program voltage Vpgmb−1, which is applied to the selected word line in the (b−1)-th program loop PLb−1 may be applied to the selected word line in the b-th program loop PLb.

Thereafter, in the program loops, when the number of turned off memory cells is greater than or equal to the second reference value REF_VAL2 and less than the third reference value REF_VAL3, the size of the step voltage may be set to the size obtained by summing the first step voltage Vstep1 and the third offset voltage Voffset3. That is, as the program loop proceeds, the size of the program voltage may increase by the size obtained by summing the first step voltage Vstep1 and the third offset voltage Voffset3.

In an embodiment, in a (c−1)-th program loop PLc−1 performed before a c-th program loop PLC, the number of turned off memory cells may be greater than or equal to the third reference value REF_VAL3 during the pre-verify operation or the main verify operation. In this case, in the c-th program loop PLc, which is the next program loop, the size of the step voltage may be set as the first step voltage Vstep1. Therefore, a program voltage Vpgmc−1+Vstep1 of a size obtained by summing the first step voltage Vstep1 and a (c−1)-th program voltage Vpgmc−1, which is applied to the selected word line in the (c−1)-th program loop PLc−1, may be applied to the selected word line in the c-th program loop PLc.

Thereafter, in the program loops, when the number of turned off memory cells is greater than or equal to the third reference value REF_VAL3, the step voltage may be set as the first step voltage Vstep1. That is, as the program loop proceeds, the size of the program voltage may increase by the first step voltage Vstep1.

As a result, as the program loop proceeds, the size of the step voltage may be set differently based on the number of turned off memory cells, thereby improving the program speed.

Figure 10:
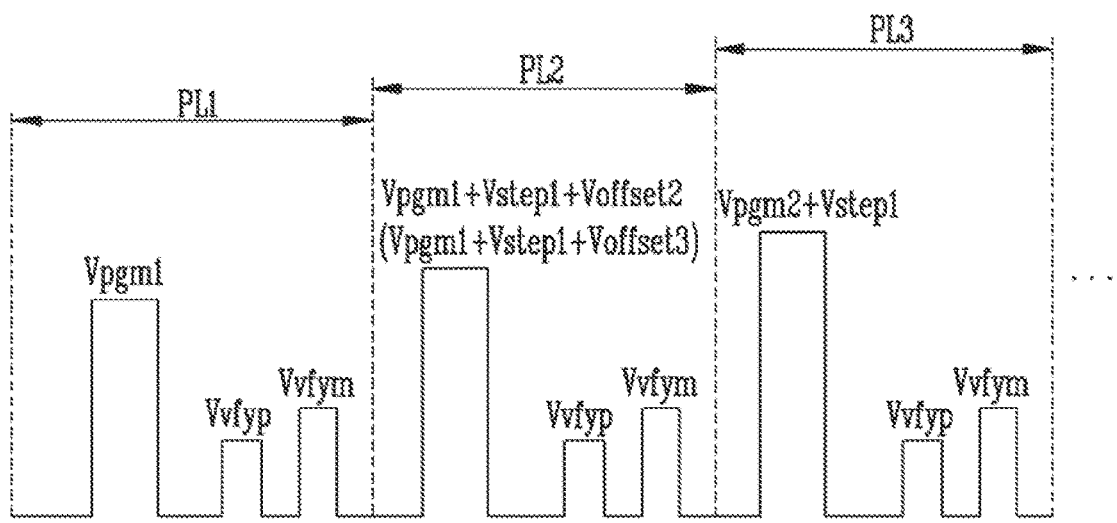
FIG. 10 illustrates another embodiment of a step voltage, determined when the number of reference values is plural, and program loops.

FIG. 10 illustrates another embodiment of a step voltage determined when the number of reference values is plural and program loops.

Referring to FIGS. 7 and 10, FIG. 10 shows a step voltage determined based on a result of comparing the number of turned off memory cells OFFCELL_NUM included in the count information COUNT_INF of FIG. 7 and second and third reference values REF_VAL2 and REF_VAL3, and the program loops performed with the determined step voltage. The second and third reference values REF_VAL2 and REF_VAL3 may be set in advance.

Referring to FIGS. 9 and 10, differently from FIG. 9, FIG. 10 shows an embodiment in which the step voltage according to the present disclosure is reflected only in the second program loop PL2.

In the present drawing, a description of the content overlapping with that of FIG. 9 is omitted.

In an embodiment, during the pre-verify operation or the main verify operation of the first program loop PL1, when the number of turned off memory cells is less than the second reference value REF_VAL2, the size of the program voltage applied to the selected word line in the second program loop PL2 may be set to a size Vpgm1+Vstep1+Voffset2 obtained by adding a first step voltage Vstep1 and a second offset voltage Voffset2 to a first program voltage Vpgm1. The first step voltage Vstep1 may be a preset default step voltage when programming the selected memory cells in the ISPP method. In addition, a size of the second offset voltage Voffset2 may decrease as the number of times of the program operations and the erase operations performed on the selected memory cells increases.

However, when the number of turned off memory cells is greater than or equal to the second reference value REF_VAL2 and less than the third reference value REF_VAL3, the size of the program voltage applied to the selected word line in the second program loop PL2 may be set to a size Vpgm1+Vstep1+Voffset3 obtained by adding the first step voltage Vstep1 and a third offset voltage Voffset3 to the first program voltage Vpgm1. At this time, a size of the third offset voltage Voffset3 may be less than the second offset voltage Voffset2. In addition, the size of the third offset voltage Voffset3 may decrease as the number of times of the program operations and the erase operations performed on selected memory cells increases.

In addition, when the number of turned off memory cells is greater than or equal to the third reference value REF_VAL3, the size of the program voltage applied to the selected word line in the second program loop PL2 may be set to a size Vpgm1+Vstep1 obtained by adding the first step voltage Vstep1 to the first program voltage Vpgm1.

In an embodiment, in the program loops after the third program loop PL3, the size of the program voltage may increase by the size of the first step voltage Vstep1. That is, the size of the voltage applied to the selected word line in the third program loop PL3 may be set to a size Vpgm2+Vstep1 obtained by adding the first step voltage Vstep1 to a second program voltage Vpgm2 applied in the second program loop PL2.

Therefore, the offset voltage and the step voltage determined based on the number of turned off memory cells may be reflected only in the second program loop PL2, and in program loops after the third program loop PL3, a voltage greater than the program voltage, which is applied to the selected word line in the previous program loop, by the first step voltage Vstep1 may be applied to the selected word line.

As a result, the step voltage may be set differently based on the number of turned off memory cells in the second program loop PL2, thereby improving the program speed.

Figure 11:
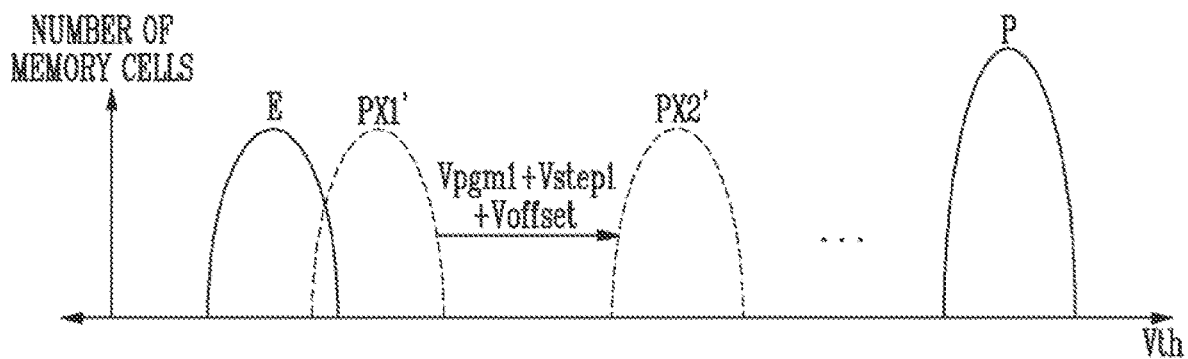
FIG. 11 illustrates a threshold voltage distribution moved whenever the program loops of FIGS. 8 to 10 proceed.

FIG. 11 illustrates a threshold voltage distribution moved whenever the program loops of FIGS. 8 to 10 proceed.

Referring to FIGS. 8 to 11, FIG. 11 shows a threshold voltage distribution movement of the memory cells when the program loops are sequentially performed in FIGS. 8 to 10. In FIG. 11, a horizontal axis represents the threshold voltage Vth of the memory cells, and a vertical axis represents the number of memory cells. In FIG. 11, it is assumed that the memory device 100 of FIG. 1 performs a program operation by the SLC method.

In an embodiment, when the program operation is performed on the selected memory cells of the erase state E, the plurality of program loops of FIGS. 8 to 10 may be performed. That is, as the program loop proceeds, the plurality of program loops may be performed with the program voltage increased by the set step voltage. At this time, the memory cells of the erase state E may be programmed to the target program state P through various states.

When comparing with FIG. 6, in FIG. 11, a width of the movement of the threshold voltage distribution of the selected memory cells may be greater than that of FIG. 6.

In an embodiment, when the first program loop PL1 is performed on the selected memory cells, the threshold voltage distribution of the memory cells of the erase state E may be programmed to a PX1' distribution.

In an embodiment, a program voltage to be applied to the selected word line in the second program loop PL2 may be determined based on a result of comparing the number of turned off memory cells with the reference value in the first program loop PL1. For example, the size of the voltage applied to the selected word line in the second program loop PL2 may be a size Vpgm1+Vstep1+Voffset obtained by adding the first step voltage Vstep1 and the offset voltage Voffset to the first program voltage Vpgm1.

Therefore, in the second program loop PL2, the program voltage of the size Vpgm1+Vstep1+Voffset obtained by adding the first step voltage Vstep1 and the offset voltage Voffset to the first program voltage Vpgm1 rather than a program voltage of the size Vpgm1+Vstep1 obtained by adding the first step voltage Vstep1 to the first program voltage Vpgm1 may be applied to the selected word line, and thus the movement width of the threshold voltage distribution of the selected memory cells may be large.

That is, when referring to FIG. 6, when the second program loop PL2 is performed in FIG. 6, the threshold voltage distribution of the memory cells is changed from the PX1 distribution to the PX2 distribution. However, in FIG. 11, when the second program loop PL2 is performed, the threshold voltage distribution of the memory cells may be changed from the PX1' distribution to a PX2' distribution.

As a result, the size of the step voltage may be set differently as the program loop proceeds, thereby improving the program speed.

Figure 12:
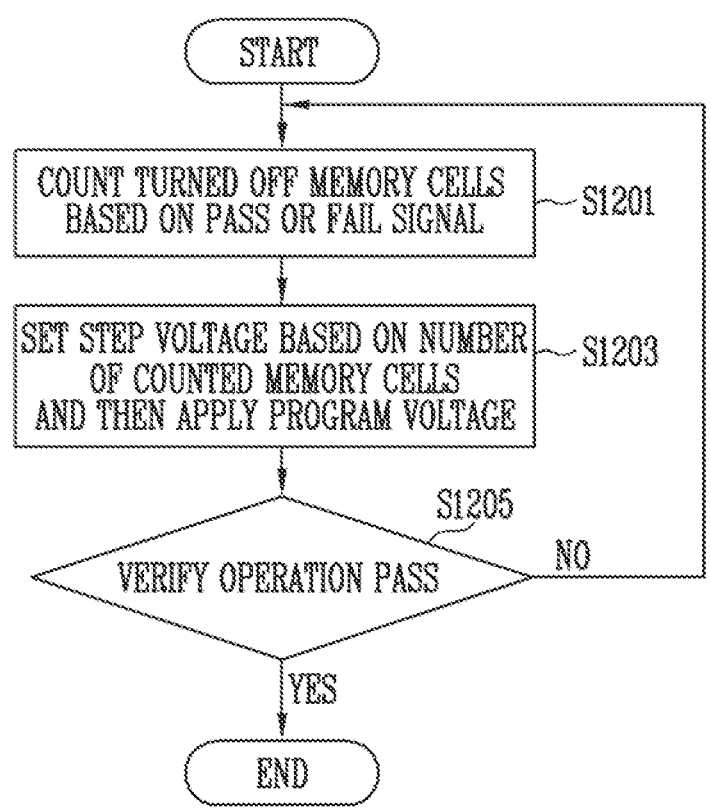
FIG. 12 is a diagram illustrating an operation of a memory device according to an embodiment of the present disclosure.

FIG. 12 is a diagram illustrating an operation of a memory device according to an embodiment of the present disclosure.

Referring to FIG. 12, in step S1201, the memory device may count the turned off memory cells based on the pass or fail signal. Specifically, when the memory device performs the plurality of program loops to program the selected memory cells, the memory device may count the turned off memory cells in the pre-verify operation or the main verify operation.

When the memory device programs the selected memory cells through the DPGM, the memory device may count the turned off memory cells in the pre-verify operation or the main verify operation, and when the memory device programs the selected memory cells through the normal program operation, the memory device may count the turned off memory cells in the main verify operation.

In step S1203, the memory device may set the step voltage based on the counted number of memory cells and then apply the program voltage to the selected word line. For example, when the number of counted memory cells is less than the reference value, the memory device may set the step voltage to a size obtained by adding the offset voltage to the existing step voltage. When the step voltage is set, the memory device may apply a voltage of the size, which is obtained by adding the set step voltage to the program voltage applied to the selected word line in the previous program loop, to the selected word line.

In step S1205, the memory device may determine whether the verify operation is passed. When the verify operation is not passed (NO), the memory device may proceed to step S1201 again, count the number of turned off memory cells, and set the step voltage again based on the counted number of memory cells.

Figure 13:
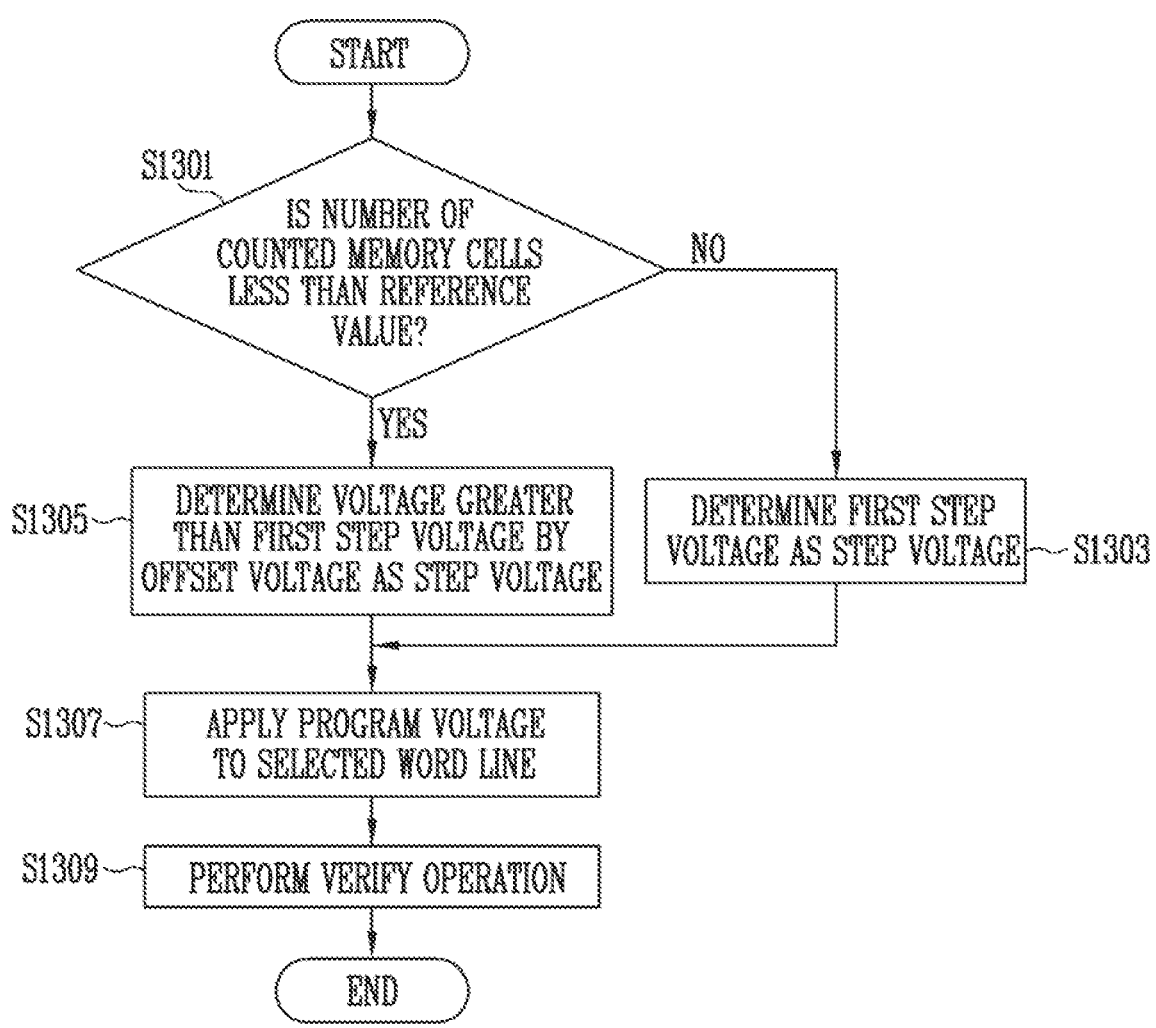
FIG. 13 is a diagram illustrating an operation of a memory device according to an embodiment of the present disclosure.

FIG. 13 is a diagram illustrating an operation of a memory device according to an embodiment of the present disclosure.

Referring to FIGS. 12 and 13, FIG. 13 shows steps subdividing step S1203 of FIG. 12.

In step S1301, the memory device may determine whether the number of counted memory cells is less than the reference value. That is, the memory device may compare the number of turned off memory cells with the reference value.

When the number of counted memory cells is greater than or equal to the reference value (NO), the operation may proceed to step S1303, and when the number of counted memory cells is less than the reference value (YES), the operation may proceed to step S1305.

When the number of counted memory cells is greater than or equal to the reference value (NO), then in step S1303, the memory device may determine the first step voltage as the step voltage. The first step voltage may be the preset default step voltage when programming the selected memory cells by the ISPP method.

However, when the number of counted memory cells is less than the reference value (YES), then in step S1305, the memory device may determine a voltage greater than the first step voltage by the offset voltage as the step voltage. That is, when the number of counted memory cells is less than the reference value, the memory device may set the step voltage higher than the preset default step voltage by the offset voltage.

When the step voltage is set, in step S1307, the memory device may apply the program voltage to the selected word line. At this time, the program voltage may be a voltage greater than the program voltage applied to the selected word line in the previous program loop by the set step voltage.

In step S1309, the memory device may perform the verify operation. At this time, the verify operation may be the pre-verify operation or the main verify operation. That is, when programming the selected memory cells through the normal program operation, the verify operation may be the main verify operation, and when programming the selected memory cells through the DPGM, the verify operation may be the pre-verify operation or the main verify operation.

In an embodiment, when the verify operation is passed, the program loop may be ended, but when the verify operation is failed, the next program loop may be performed. In the next program loop, the memory device may determine the step voltage again based on the number of turned off memory cells.

As a result, until the number of turned off memory cells is greater than or equal to the reference value, the step voltage may be set to a value greater than the preset default step voltage by the offset voltage. When the number of turned off memory cells is greater than or equal to the reference value, the step voltage may be set to the preset default step voltage.

Figure 14:
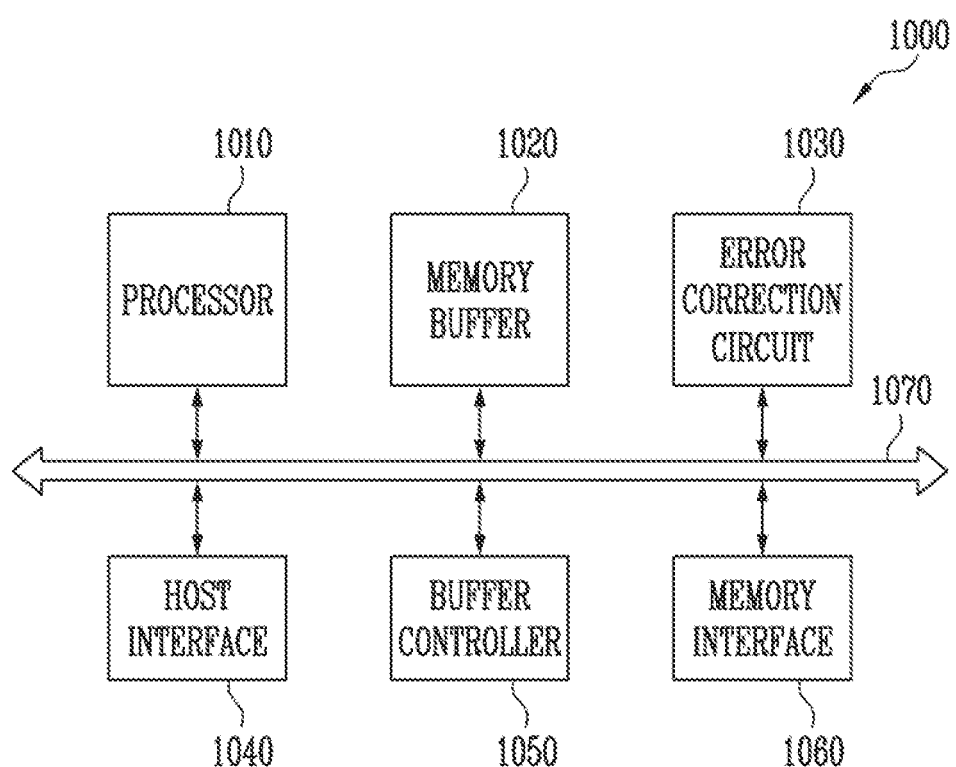
FIG. 14 is a diagram illustrating another embodiment of a memory controller of FIG. 1.

FIG. 14 is a diagram illustrating another embodiment of the memory controller of FIG. 1.

The memory controller 1000 is connected to a host and a memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 14, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include static RAM (SRAM) or dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory Interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1020, and the memory interface 1060.

Figure 15:
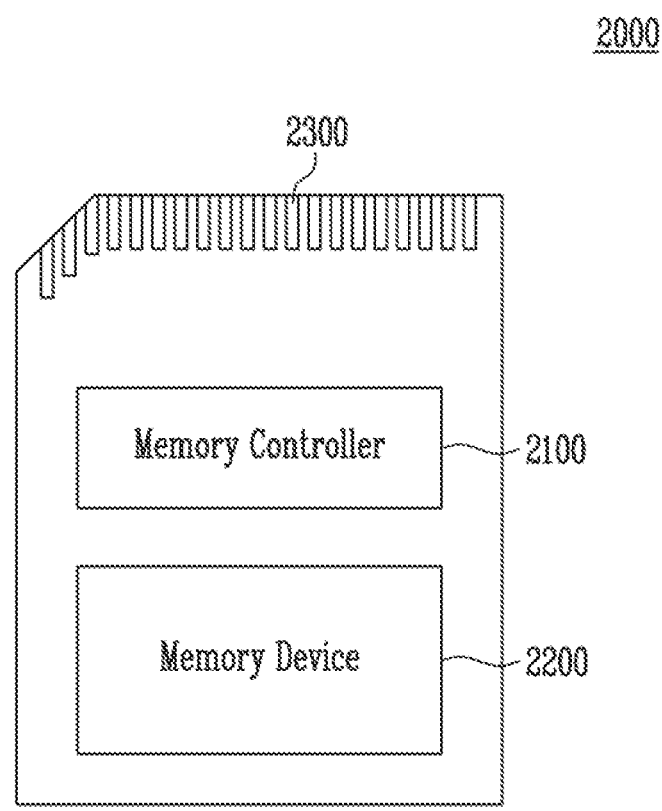
FIG. 15 is a block diagram illustrating a memory card system to which a storage device according to an embodiment of the present disclosure is applied.

FIG. 15 is a block diagram illustrating a memory card system 2000 to which the storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented identically to the memory device 100 of FIG. 1 described with reference to FIG. 1.

As an example, the memory controller 2100 may include components such as random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented using various nonvolatile memory types, such as electrically erasable and programmable ROM (EEPROM), NAND flash memory, NOR flash memory, phase-change RAM (PRAM), resistive RAM (ReRAM), ferroelectric RAM (FRAM), and spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, the memory device 2200 may program the selected memory cells. At this time, the memory device 2200 may program the selected memory cells through the normal program operation or the DPGM. In the DPGM, the memory device 2200 may perform the pre-verify operation performed with the pre-verify voltage and the main verify operation performed with the main verify voltage greater than the pre-verify voltage.

In an embodiment, the memory device 2200 may count the number of turned off memory cells in the pre-verify operation or the main verify operation. In addition, the memory device 2200 may determine the step voltage to be reflected in the next program loop based on the result of comparing the number of turned off memory cells with the reference value.

For example, when the number of turned off memory cells is less than the reference value, the memory device 2200 may set the step voltage of the next program loop to a size larger than the default step voltage by the offset voltage. Here, the offset voltage may decrease as the number of times of the program operations and the erase operations performed on the selected memory cells increases.

However, when the number of turned off memory cells is greater than or equal to the reference value, the memory device 2200 may set the step voltage of the next program loop as the default step voltage.

Therefore, the memory device 2200 may set the step voltage to the size greater than the default step voltage by the offset voltage until the number of turned off memory cells is greater than or equal to the reference value. Thereafter, when the number of turned off memory cells is greater than or equal to the reference value, the memory device 2200 may set the default step voltage as the step voltage.

Figure 16:
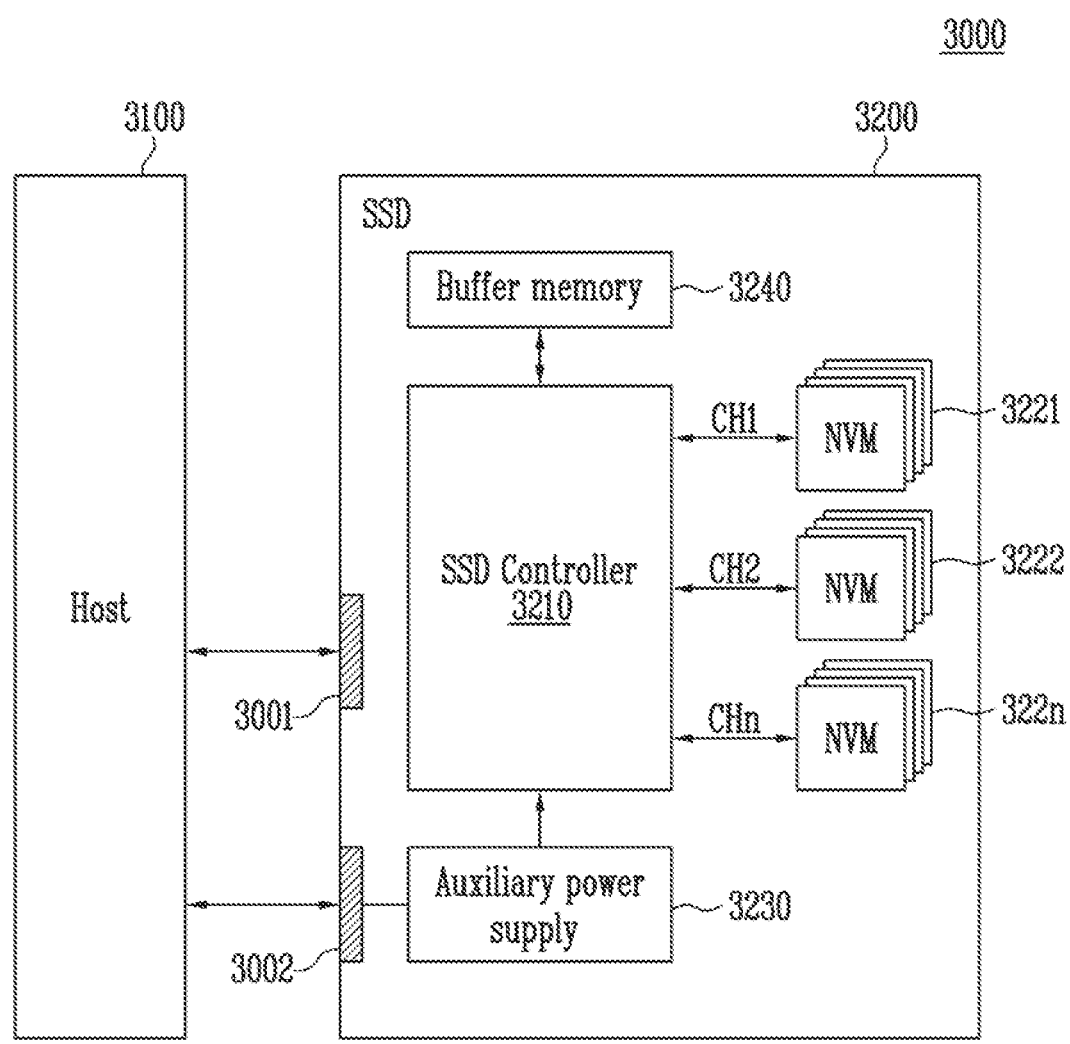
FIG. 16 is a block diagram illustrating a solid state drive (SSD) system to which a storage device according to an embodiment of the present disclosure is applied.

FIG. 16 is a block diagram illustrating a solid state drive (SSD) system 3000 to which the storage device according to an embodiment of the present disclosure is applied.

Referring to FIG. 16, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG. 1.

The SSD controller 3210 may control the plurality of flash memories 3221 to 322n in response to the signal SIG received from the host 3100. As an example, the signal SIG may be a signal based on an interface between the host 3100 and the SSD 3200. For example, the signal SIG may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include volatile memory such as a DRAM, SDRAM, DDR SDRAM, LPDDR SDRAM, and GRAM; or nonvolatile memory such as FRAM, ReRAM, STT-MRAM, and PRAM.

In an embodiment, each of the plurality of flash memories 3221 to 322n may program the selected memory cells. At this time, the plurality of flash memories 3221 to 322n may program the selected memory cells through the normal program operation or the DPGM. In the DPGM, the plurality of flash memories 3221 to 322n may perform the pre-verify operation performed with the pre-verify voltage and the main verify operation performed with the main verify voltage greater than the pre-verify voltage.

In an embodiment, the plurality of flash memories 3221 to 322n may count the number of turned off memory cells in the pre-verify operation or the main verify operation. In addition, the plurality of flash memories 3221 to 322n may determine the step voltage to be reflected in the next program loop based on the result of comparing the number of turned off memory cells with the reference value.

For example, when the number of turned off memory cells is less than the reference value, the plurality of flash memories 3221 to 322n may set the step voltage of the next program loop to the size larger than the default step voltage by the offset voltage. Here, the offset voltage may decrease as the number of times of the program operations and the erase operations performed on the selected memory cells increases.

However, when the number of turned off memory cells is greater than or equal to the reference value, the plurality of flash memories 3221 to 322n may set the step voltage of the next program loop as the default step voltage.

Therefore, the plurality of flash memories 3221 to 322n may set the step voltage to the size greater than the default step voltage by the offset voltage until the number of turned off memory cells is greater than or equal to the reference value. Thereafter, when the number of turned off memory cells is greater than or equal to the reference value, the plurality of flash memories 3221 to 322n may set the default step voltage as the step voltage.

Figure 17:
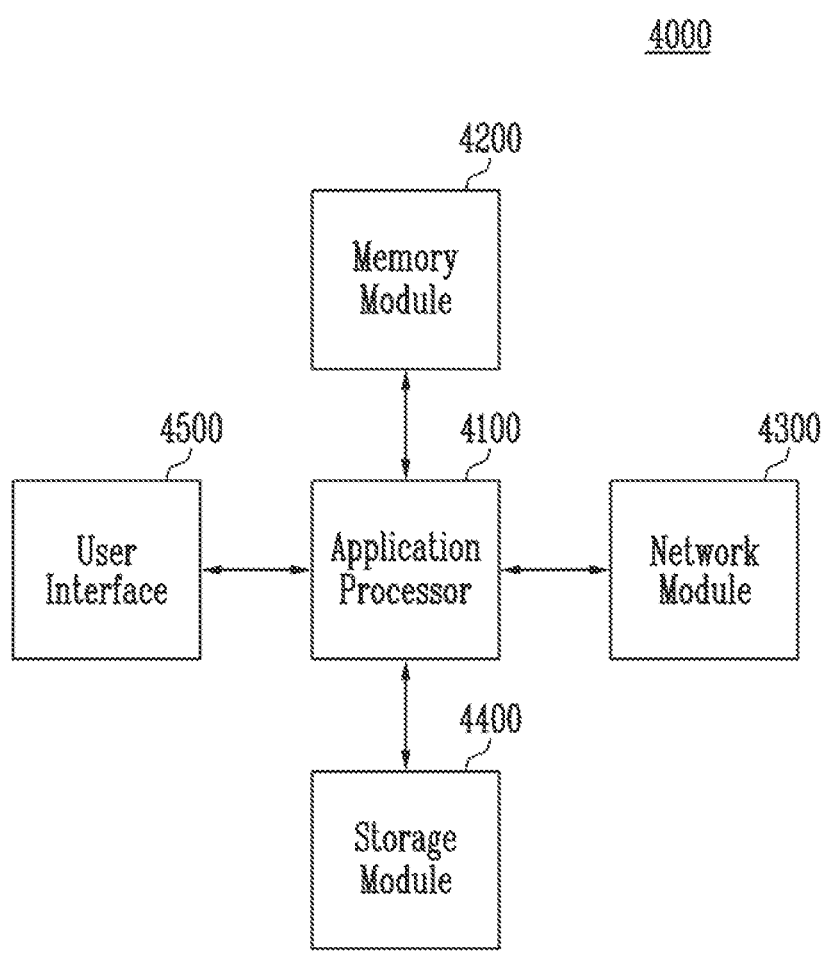
FIG. 17 is a block diagram illustrating a user system to which a storage device according to an embodiment of the present disclosure is applied.

FIG. 17 is a block diagram illustrating a user system 4000 to which the storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as main memory, operation memory, buffer memory, or cache memory of the user system 4000. The memory module 4200 may include volatile random access memory such as DRAM, SDRAM, DDR SDRAM, DDR2 SDRAM, DDR3 SDRAM, LPDDR SDARM, LPDDR2 SDRAM, and LPDDR3 SDRAM, or nonvolatile random access memory, such as PRAM, ReRAM, MRAM, and FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented using nonvolatile semiconductor memory, such as phase-change RAM (PRAM), magnetic RAM (MRAM), resistive RAM (RRAM), NAND flash, NOR flash, and three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

In an embodiment, the storage module 4400 may program the selected memory cells. At this time, the storage module 4400 may program the selected memory cells through the normal program operation or the DPGM. In the DPGM, the storage module 4400 may perform the pre-verify operation performed with the pre-verify voltage and the main verify operation performed with the main verify voltage greater than the pre-verify voltage.

In an embodiment, the storage module 4400 may count the number of turned off memory cells in the pre-verify operation or the main verify operation. In addition, the storage module 4400 may determine the step voltage to be reflected in the next program loop based on the result of comparing the number of turned off memory cells with the reference value.

For example, when the number of turned off memory cells is less than the reference value, the storage module 4400 may set the step voltage of the next program loop to the size larger than the default step voltage by the offset voltage. Here, the offset voltage may decrease as the number of times of the program operations and the erase operations performed on the selected memory cells increases.

However, when the number of turned off memory cells is greater than or equal to the reference value, the storage module 4400 may set the step voltage of the next program loop as the default step voltage.

Therefore, the storage module 4400 may set the step voltage to the size greater than the default step voltage by the offset voltage until the number of turned off memory cells is greater than or equal to the reference value. Thereafter, when the number of turned off memory cells is greater than or equal to the reference value, the storage module 4400 may set the default step voltage as the step voltage.

What is claimed is:

1. A memory device comprising:
 a memory cell array including a plurality of memory cells connected to a plurality of word lines;
 a peripheral circuit configured to perform a plurality of program loops to program memory cells, among the plurality of memory cells, connected to a selected word line among the plurality of word lines; and
 control logic configured to control the peripheral circuit to set a step voltage based on the number of turned off memory cells among the selected memory cells and then apply a program voltage, to which the step voltage is added, to the selected word line in a next program loop, during a verify operation of a program operation and the verify operation included in each of the plurality of program loops.

2. The memory device of claim 1, wherein, when the plurality of program loops are performed with a double verify program:
 the verify operation is any of a pre-verify operation performed with a pre-verify voltage and a main verify operation performed with a main verify voltage greater than the pre-verify voltage; and
 the control logic is configured to set the step voltage based on the number of turned off memory cells during the pre-verify operation or the main verify operation.

3. The memory device of claim 1, wherein the control logic is configured to set the step voltage to a size obtained by adding an offset voltage to a default step voltage when the number of the turned off memory cells is less than a preset reference value.

4. The memory device of claim 3, wherein the offset voltage is set based on the number of times the program operations and the number of times erase operations are performed on the selected memory cells.

5. The memory device of claim 4, wherein the control logic is configured to decrease the offset voltage as the number of times the program operations and the number of times the erase operations increase.

6. The memory device of claim 3, wherein the control logic is configured to set the step voltage to the size obtained by adding the offset voltage to the default step voltage until the number of the turned off memory cells is greater than or equal to the preset reference value.

7. The memory device of claim 6, wherein the control logic is configured to set the default step voltage as the step voltage when the number of the turned off memory cells is greater than or equal to the preset reference value.

8. The memory device of claim 3, wherein the control logic is configured to apply the program voltage in which the step voltage is set to the size obtained by adding the offset voltage to the default step voltage to the selected word line, and then to set the step voltage to the default step voltage.

9. The memory device of claim 1, wherein the control logic is configured to set a default step voltage as the step voltage when the number of the turned off memory cells is greater than or equal to a preset reference value.

10. The memory device of claim 1, wherein the control logic is configured to:
set the step voltage to a size obtained by adding a first offset voltage to a default step voltage when the number of the turned off memory cells is less than a preset first reference value; and
set the step voltage to a size obtained by adding a second offset voltage to the default step voltage when the number of the turned off memory cells is greater than or equal to the first reference value and less than a preset second reference value.

11. The memory device of claim 10, wherein the first offset voltage is greater than the second offset voltage.

12. The memory device of claim 10, wherein the control logic is configured to set, when the step voltage is determined as the size obtained by adding the first offset voltage to the default step voltage, the step voltage to the size obtained by adding the first offset voltage to the default step voltage until the number of the turned off memory cells is greater than or equal to the first reference value and less than the second reference value.

13. The memory device of claim 12, wherein the control logic is configured to set the step voltage to the size obtained by adding the second offset voltage to the default step voltage when the number of the turned off memory cells is greater than or equal to the first reference value and less than the second reference value.

14. The memory device of claim 13, wherein the control logic is configured to set the step voltage to the size obtained by adding the second offset voltage to the default step voltage until the number of the turned off memory cells is greater than or equal to the second reference value.

15. The memory device of claim 14, wherein the control logic is configured to set the default step voltage as the step voltage when the number of the turned off memory cells is greater than or equal to the second reference value.

16. A memory device comprising:
a memory cell array including a plurality of memory cells connected to a plurality of word lines;
a peripheral circuit configured to perform a plurality of program loops to program memory cells, among the plurality of memory cells, connected to a selected word line among the plurality of word lines; and
control logic including a memory cell counter to count the number of turned off memory cells among the selected memory cells, and a step voltage controller to control the peripheral circuit to set a step voltage based on the number of the turned off memory cells and then to apply a program voltage, to which the step voltage is added, to the selected word line in a next program loop, during a verify operation of a program operation and the verify operation included in each of the plurality of program loops.

17. The memory device of claim 16, wherein the step voltage controller is configured to control the peripheral circuit to set the step voltage to a size obtained by adding an offset voltage to a default step voltage when the number of the turned off memory cells is less than a preset reference value, and to apply a program voltage greater than the program voltage in the previous program loop by the step voltage to the selected word line in a next program loop.

18. The memory device of claim 17, wherein the step voltage controller is configured to:
set the step voltage to the size obtained by adding the offset voltage to the default step voltage until the number of the turned off memory cells is greater than or equal to the preset reference value; and
set the default step voltage as the step voltage when the number of the turned off memory cells is greater than or equal to the preset reference value.

19. A method of operating a memory device including a plurality of memory cells connected to each of a plurality of word lines, the method comprising:
performing a program operation by applying a program voltage to a selected word line among the plurality of word lines;
performing a verify operation by applying a verify voltage to the selected word line;
counting turned off memory cells among selected memory cells connected to the selected word line during the verify operation;
setting a step voltage based on the counted number of turned off memory cells; and
applying a program voltage, to which the step voltage is added, to the selected word line.

20. The method of claim 19, wherein setting the step voltage comprises setting the step voltage to a size obtained by adding an offset voltage to a default step voltage when the number of the turned off memory cells is less than a preset reference value.

21. The method of claim 20, wherein setting the step voltage comprises:
setting the step voltage to the size obtained by adding the offset voltage to the default step voltage until the number of the turned off memory cells is greater than or equal to the preset reference value; and
setting the step voltage to the default step voltage when the number of the turned off memory cells is greater than or equal to the preset reference value.

* * * * *